(12) United States Patent
Hashimoto et al.

(10) Patent No.: US 8,764,903 B2
(45) Date of Patent: Jul. 1, 2014

(54) GROWTH REACTOR FOR GALLIUM-NITRIDE CRYSTALS USING AMMONIA AND HYDROGEN CHLORIDE

(75) Inventors: Tadao Hashimoto, Santa Barbara, CA (US); Edward Letts, Buellton, CA (US)

(73) Assignee: Sixpoint Materials, Inc., Buellton, CA (US)

( * ) Notice: Subject to any disclaimer, the term of this patent is extended or adjusted under 35 U.S.C. 154(b) by 1044 days.

(21) Appl. No.: 12/774,677

(22) Filed: May 5, 2010

(65) Prior Publication Data

US 2010/0285657 A1    Nov. 11, 2010

Related U.S. Application Data

(60) Provisional application No. 61/175,618, filed on May 5, 2009.

(51) Int. Cl.
*C23C 16/00*    (2006.01)

(52) U.S. Cl.
USPC ........... 118/726; 118/715; 118/719; 118/724; 438/478; 438/483; 438/603; 438/796; 257/E21.108

(58) Field of Classification Search
None
See application file for complete search history.

(56) References Cited

U.S. PATENT DOCUMENTS

| | | | |
|---|---|---|---|
| 2,962,838 A | | 12/1960 | Kebler et al. |
| 5,942,148 A | | 8/1999 | Preston |
| 6,117,213 A | * | 9/2000 | Ueda et al. ............ 95/273 |
| 6,156,581 A | * | 12/2000 | Vaudo et al. ............ 438/22 |

(Continued)

FOREIGN PATENT DOCUMENTS

| | | |
|---|---|---|
| CN | 101061570 | 10/2007 |
| EP | 0827192 | 4/1998 |

(Continued)

OTHER PUBLICATIONS

PCT/US2009/035140, WO International Search Report dated May 29, 2009, pp. 4.

(Continued)

*Primary Examiner* — Zandra Smith
*Assistant Examiner* — Khanh Duong
(74) *Attorney, Agent, or Firm* — K & L Gates LLP

(57) ABSTRACT

The present invention in one preferred embodiment discloses a new design of HVPE reactor, which can grow gallium nitride for more than one day without interruption. To avoid clogging in the exhaust system, a second reactor chamber is added after a main reactor where GaN is produced. The second reactor chamber may be configured to enhance ammonium chloride formation, and the powder may be collected efficiently in it. To avoid ammonium chloride formation in the main reactor, the connection between the main reactor and the second reaction chamber can be maintained at elevated temperature. In addition, the second reactor chamber may have two or more exhaust lines. If one exhaust line becomes clogged with powder, the valve for an alternative exhaust line may open and the valve for the clogged line may be closed to avoid overpressuring the system. The quartz-made main reactor may have e.g. a pyrolytic boron nitride liner to collect polycrystalline gallium nitride efficiently. The new HYPE reactor which can grow gallium nitride crystals for more than 1 day may produce enough source material for ammonothermal growth. Single crystalline gallium nitride and polycrystalline gallium nitride from the HYPE reactor may be used as seed crystals and a nutrient for ammonothermal group III-nitride growth.

10 Claims, 1 Drawing Sheet

(56) References Cited

U.S. PATENT DOCUMENTS

| | | |
|---|---|---|
| 6,177,057 B1 | 1/2001 | Purdy |
| 6,177,059 B1 | 1/2001 | Matsuda et al. |
| 6,316,785 B1 | 11/2001 | Nunoue et al. |
| 6,326,313 B1 | 12/2001 | Couteau et al. |
| 6,398,867 B1 | 6/2002 | D'Evelyn et al. |
| 6,406,540 B1 | 6/2002 | Harris |
| 6,441,393 B2 | 8/2002 | Goetz et al. |
| 6,569,238 B2 | 5/2003 | Ishida |
| 6,596,079 B1 * | 7/2003 | Vaudo et al. ............... 117/97 |
| 6,656,615 B2 | 12/2003 | Dwilinski et al. |
| 7,033,439 B2 * | 4/2006 | Shibata et al. ............. 117/200 |
| 7,078,731 B2 | 7/2006 | D'Evelyn et al. |
| 7,132,730 B2 | 11/2006 | Dwilinski et al. |
| 7,160,388 B2 | 1/2007 | Dwilinski et al. |
| 7,169,227 B2 | 1/2007 | Maruska et al. |
| 7,170,095 B2 | 1/2007 | Vaudo et al. |
| 7,303,632 B2 | 12/2007 | Negley |
| 7,368,015 B2 | 5/2008 | D'Evelyn et al. |
| 7,589,000 B2 * | 9/2009 | Kasai et al. ............... 438/478 |
| 7,749,325 B2 * | 7/2010 | Nakayama ............... 117/97 |
| 7,847,313 B2 * | 12/2010 | Shibata ............... 257/101 |
| 8,092,597 B2 | 1/2012 | Dmitriev et al. |
| 8,236,267 B2 | 8/2012 | Hashimoto et al. |
| 8,337,798 B2 * | 12/2012 | Sarayama et al. ........... 423/409 |
| 2002/0078881 A1 | 6/2002 | Cuomo et al. |
| 2002/0144645 A1 | 10/2002 | Kim et al. |
| 2002/0177312 A1 | 11/2002 | Tsvetkov et al. |
| 2002/0192507 A1 | 12/2002 | Dwilinski et al. |
| 2003/0024475 A1 | 2/2003 | Anderson |
| 2004/0051105 A1 | 3/2004 | Tsuda et al. |
| 2004/0072383 A1 | 4/2004 | Nagahama et al. |
| 2004/0089221 A1 | 5/2004 | Dwilinski et al. |
| 2004/0124434 A1 | 7/2004 | D'Evelyn et al. |
| 2004/0226588 A1 | 11/2004 | Onishi et al. |
| 2004/0245535 A1 | 12/2004 | D'Evelyn et al. |
| 2004/0261692 A1 | 12/2004 | Dwilinski et al. |
| 2004/0262630 A1 | 12/2004 | Kitaoka et al. |
| 2005/0053513 A1 | 3/2005 | Pike, Jr. |
| 2005/0059229 A1 | 3/2005 | Minemoto et al. |
| 2005/0098095 A1 | 5/2005 | D'Evelyn et al. |
| 2005/0121688 A1 | 6/2005 | Nagai et al. |
| 2005/0126471 A1 | 6/2005 | Jenny et al. |
| 2005/0142391 A1 | 6/2005 | Dmitriev et al. |
| 2005/0161697 A1 | 7/2005 | Nakahata et al. |
| 2005/0166835 A1 | 8/2005 | Koukitsu et al. |
| 2005/0224783 A1 | 10/2005 | Matsuyama et al. |
| 2005/0258451 A1 | 11/2005 | Saxler et al. |
| 2006/0037530 A1 | 2/2006 | Dwilinski et al. |
| 2006/0054076 A1 | 3/2006 | Dwilinski et al. |
| 2006/0057749 A1 | 3/2006 | Dwilinski et al. |
| 2006/0118799 A1 | 6/2006 | D'Evelyn et al. |
| 2006/0177362 A1 | 8/2006 | D'Evelyn et al. |
| 2006/0210800 A1 | 9/2006 | Spitsberg et al. |
| 2006/0213430 A1 | 9/2006 | Jenny et al. |
| 2006/0255341 A1 | 11/2006 | Pinnington et al. |
| 2006/0280668 A1 | 12/2006 | Dmitriev et al. |
| 2006/0282229 A1 | 12/2006 | Kim et al. |
| 2007/0012242 A1 | 1/2007 | Jurisch et al. |
| 2007/0032046 A1 | 2/2007 | Dmitriev et al. |
| 2007/0084399 A1 | 4/2007 | Sarayama et al. |
| 2007/0157876 A1 | 7/2007 | Minemoto et al. |
| 2007/0158785 A1 | 7/2007 | D'Evelyn et al. |
| 2007/0218703 A1 | 9/2007 | Kaeding et al. |
| 2007/0234946 A1 | 10/2007 | Hashimoto et al. |
| 2007/0240630 A1 | 10/2007 | Leonard et al. |
| 2007/0252164 A1 | 11/2007 | Zhong et al. |
| 2007/0290230 A1 | 12/2007 | Kawaguchi et al. |
| 2008/0001165 A1 | 1/2008 | Hashimoto et al. |
| 2008/0006844 A1 | 1/2008 | D'Evelyn et al. |
| 2008/0008855 A1 | 1/2008 | D'Evelyn et al. |
| 2008/0102016 A1 | 5/2008 | Hashimoto et al. |
| 2008/0111144 A1 | 5/2008 | Fichtenbaum et al. |
| 2008/0118733 A1 | 5/2008 | Oshima |
| 2008/0156254 A1 | 7/2008 | Dwilinski et al. |
| 2009/0256240 A1 | 10/2009 | Hashimoto et al. |
| 2009/0309105 A1 | 12/2009 | Letts et al. |
| 2009/0315151 A1 | 12/2009 | Hashimoto et al. |
| 2010/0068118 A1 | 3/2010 | Hashimoto et al. |
| 2010/0095882 A1 | 4/2010 | Hashimoto et al. |
| 2010/0126411 A1 | 5/2010 | Hashimoto et al. |
| 2010/0213576 A1 | 8/2010 | Hiranaka et al. |
| 2013/0119399 A1 | 5/2013 | Hashimoto et al. |
| 2013/0135005 A1 | 5/2013 | Hashimoto et al. |
| 2013/0206057 A1 | 8/2013 | Hashimoto et al. |

FOREIGN PATENT DOCUMENTS

| | | |
|---|---|---|
| EP | 1041610 A1 | 4/2000 |
| EP | 1 110 600 A2 | 6/2001 |
| EP | 1172464 | 1/2002 |
| EP | 1 818 429 A2 | 8/2007 |
| JP | 50/109896 | 8/1975 |
| JP | 10-125753 | 5/1998 |
| JP | 2001/102307 | 4/2001 |
| JP | 2002-029897 | 1/2002 |
| JP | 2002/261014 A | 9/2002 |
| JP | 2003-040699 | 2/2003 |
| JP | 2004-002152 | 8/2004 |
| JP | 2004-284876 | 10/2004 |
| JP | 2005-008444 | 1/2005 |
| JP | 2005-288350 | 10/2005 |
| JP | 2006/069827 | 3/2006 |
| JP | 2006-509708 | 3/2006 |
| JP | 2006/193355 | 7/2006 |
| JP | 2007/238346 | 9/2007 |
| JP | 2007/238347 | 9/2007 |
| JP | 2007/262815 | 10/2007 |
| JP | 2007-290921 | 11/2007 |
| JP | 2008/501600 | 1/2008 |
| JP | 2008/127252 | 6/2008 |
| JP | 2009-536920 | 4/2009 |
| JP | 5241855 | 9/2009 |
| JP | 2013-126945 | 6/2013 |
| WO | WO 99/23693 | 5/1999 |
| WO | WO 03-035945 A2 | 5/2003 |
| WO | WO 2004-003261 A1 | 1/2004 |
| WO | WO 2004/053206 | 6/2004 |
| WO | WO 2004-061923 A1 | 7/2004 |
| WO | WO 2006-057463 A1 | 6/2006 |
| WO | WO 2006-080959 A1 | 8/2006 |
| WO | WO 2007-008198 A1 | 1/2007 |
| WO | WO 2007-078844 A2 | 7/2007 |
| WO | WO 2007-117689 A2 | 10/2007 |
| WO | WO 2007-133512 A2 | 11/2007 |
| WO | WO 2007-149487 A2 | 12/2007 |
| WO | WO 2008-051589 A2 | 5/2008 |
| WO | WO 2008/064109 A2 | 5/2008 |
| WO | WO 2009-039398 A1 | 3/2009 |
| WO | WO 2009/047894 | 4/2009 |
| WO | WO 2009-108700 A1 | 9/2009 |
| WO | WO 2009-149299 A1 | 12/2009 |
| WO | WO 2009-149300 A1 | 12/2009 |
| WO | WO 2009-151642 A1 | 12/2009 |
| WO | WO 2010-045567 A1 | 4/2010 |
| WO | WO 2010-060034 A1 | 5/2010 |

OTHER PUBLICATIONS

PCT/US2009/035140, WO Written Opinion dated May 29, 2009, pp. 6.

PCT/US2009/035140, WO International Preliminary Report on Patentability dated Mar. 17, 2010, pp. 8.

PCT/US2009/046316, WO International Search Report and Written Opinion dated Oct. 22, 2009, pp. 18.

PCT/US2009/061022, WO International Search Report and Written Opinion dated Jan. 21, 2010, pp. 10.

PCT/US2009/003557, WO International Search Report dated Oct. 26, 2009 pp. 4.

PCT/US2009/046317, WO International Search Report and Written Opinion, dated Sep. 25, 2009 pp. 15.

PCT/US2009/065513, WO International Search Report and Written Opinion, dated Feb. 3, 2010; pp. 15.

U.S. Appl. No. 12/456,181 Office Action Sep. 4, 2012.

(56) References Cited

OTHER PUBLICATIONS

U.S. Appl. No. 12/456,181 Amendment Sep. 26, 2012.
U.S. Appl. No. 12/456,181 Notice of Allowance Oct. 29, 2012.
U.S. Appl. No. 12/455,760 Office Action Nov. 23, 2011.
U.S. Appl. No. 12/455,760 Amendment Mar. 23, 2012.
U.S. Appl. No. 12/455,760 Office Action Oct. 12, 2012.
U.S. Appl. No. 12/392,960 Office Action Dec. 13, 2011.
U.S. Appl. No. 12/392,960 Amendment Mar. 13, 2012.
U.S. Appl. No. 12/392,960 Office Action Aug. 24, 2012.
U.S. Appl. No. 12/455,683 Office Action Apr. 26, 2011.
U.S. Appl. No. 12/455,683 Office Action Oct. 13, 2011.
U.S. Appl. No. 12/455,683 Amendment Feb. 13, 2012.
U.S. Appl. No. 12/455,683 Notice of Allowance Mar. 15, 2012.
U.S. Appl. No. 12/455,683 Amendment Jul. 26, 2011.
Jacobson, Loren A., Crystal Symmetries, METE 327: Physical Metallurgy, Department of Material and Metallurgical Engineering, New Mexico Institute of Mining and Technology (May 16, 2008).
Schineller, B., et al. "Vertical -HVPE as a Production Method for Free-Standing GaN-Substrates", CS Mantech Conference, May 14-17, 2007 Austin TX [USA]; [Online] 07A, pp. 123-126, XP002592188; URL: http://www.gaasmantech.org/Digests/2007/2007%20Papers/07a.pdf.
PCT/US2009/003557, International Preliminary Report on Patentability dated Dec. 14, 2010 and Written Opinion, pp. 8.
EP9762938 Amendment Dated Oct. 9, 2012.
EP9762938 Office Action dated May 30, 2012.
JP2010548751 (Japanese and English translation) Office Action dated Sep. 4, 2012.
PCT/US2009/046316 International Preliminary Report on Patentability dated Dec. 6, 2010 and Written Opinion, pp. 13.
JP2010540956 Office Action dated Aug. 14, 2012.
PCT/US09/061022 International Preliminary Report on Patentability dated Apr. 19, 2011 and Written Opinion, pp. 6.
JP2010188936 Office Action (Japanese and English translation) dated Sep. 4, 2012.
JP2010188935 Office Action (Japanese and English translation) dated Sep. 4, 2012.
JP2010188934 Office Action (Japanese and English translation) dated Sep. 4, 2012.
JP2010548951 Office Action (Japanese and English translation) dated Sep. 4, 2012.
PCT/US2009/046317 International Preliminary Report on Patentability dated Dec. 6, 2010 and Written Opinion, pp. 9.
PCT/US2009/065513 International Preliminary Report on Patentability dated May 24, 2011 and Written Opinion, pp. 8.
PCT/US2009/033790 International Search Report, dated Oct. 26, 2010 pp. 6.
Aoki, M., et al., "GaN single crystal growth using high-purity Na as a flux," Journal of Crystal Growth, 2002, pp. 70-76; 242; Elsevier, www.elsevier.com/locate/jcrysgro.
Bliss, D. F., et al., "Aluminum nitride substrate growth by halide vapor transport epitaxy," Journal of Crystal Growth, 2003, pp. 1-6, vol. 250; Elsevier, www.elsevier.com/locate/jcrysgro.
Callahan, Michael J., et al "Growth of GaN crystals under ammonothermal conditions," Material Research Society, vol. 798, 2004, pp. YS.10.1-Y2.10.6.
Callahan, M., et al., "Gan single crystals grown on HVPE seeds in alkaline supercritical ammonia," J Mater Sci, 2006, pp. 1399-1407, 41.
Chen, Q. S., et al., "Modeling of ammonothermal growth of nitrides," Journal of Crystal Growth, 2003, pp. 181-187, 258; Elsevier, www.elsevier.com/locate/jcrysgro.
Dwilinski, R., et al., "AMMONO method of BN, AlN, and GaN synthesis and crystal growth," MRS Internet Journal of Nitride Semiconductor Research, 1998, pp. 1-4; 3, 25.
Dwilinski, R., et al., AMMONO method of GaN and AlN production, Diamond and Related Materials, 1998, pp. 1348-1350, 7; Elsevier.
Dwilinski, R., et al., "On GAN Crystallization by Ammonothermal Method," Acta Physica Polonica A, 1996, pp. 763-766, No. 4, vol. 90.

Dwilinski, R., et al., "Excellent crystallinity of truly bulk ammonothermal GaN," Journal of Crystal Growth, 2008, pp. 3911-3916, 310; Elsevier, www.elsevier.com/locate/jcrysgro.
Ehrentraut, Dirk., et al., Reviewing recent development in the acid ammonthermal crystal growth of gallium nitride, Journal Of Crystal Growth, 2008, pp. 3902-3906, 310; Elsevier, www.elsevier.com/locate/jcrysgro.
Etzkorn, E. V., et al. "Cracking of GaN Films" Journal of Applied Physics, Jan. 15, 2001, pp. 1025-1034, vol. 89, No. 2, XP001011762, American Institute of Physics.
Hashimoto, Tadao et al. "A GaN bulk crystal with improved structural quality grown by the ammonothermal method," Published online: Jul. 2007; Nature Materials Advance Online Publication www.nature.com/naturematerials; pp. 1-3.
Hashimoto, Tadao et al. "Ammonothermal growth of GaN utilizing negative temperature dependence of solubility in basic ammonia" Mater. Res. Soc. Symp. Proc., 2005, pp. E2.8.1.-E.2.8.6., vol. 831, Materials Research Society.
Hashimoto, Tadao et al. "Growth of Bulk GaN Crystals by the Basic Ammonothermal Method," Japanese Journal of Applied Physics, 2007, pp. L889-L891, vol. 46, No. 37, The Japanese Society of Applied Physics, JJAP Express Letter.
Hashimoto, Tadao et al. "Growth of bulk GaN with Low Dislocation Density by the Ammonothermal Method Using Polycrystalline GaN Nutrient" Japanese Journal of Applied Physics, 2007, pp. L525-L527, vol. 46, No. 22, The Japanese Society of Applied Physics, JJAP Express Letter.
Hashimoto, Tadao et al. "Growth of gallium nitride via fluid transport in supercritical ammonia," Journal of Crystal Growth, 2005, pp. e525-e530; 275, Elsevier, www.elsevier.com/locate/jcrysgro.
Hashimoto, Tadao et al. "Phase selection of microcrystalline GaN synthesized in supercritical ammonia" Journal of Crystal Growth, 2006, pp. 100-106; 291, Elsevier, www.elsevier.com/locate/jcrysgro.
Hashimoto, Tadao et al. "Seeded growth of GaN by the basic ammonothermal method" Journal of Crystal Growth, 2007, pp. 311-316; 305, Elsevier, www.elsevier.com/locate/jcrysgro.
Hashimoto, Tadao et al. "Status and perspectives of the ammonothermal growth of GaN substrates" Journal of Crystal Growth, 2008, pp. 876-880; 310, Elsevier, www.elsevier.com/locate/jcrysgro.
Hashimoto, Tadao et al. "Structural Characterization of Thick GaN Films Grown of Free-Standing GaN Seeds by the Ammonothermal Method Using Basic Ammonia," Japanese Journal of Applied Physics, 2005, pp. L 797-L 799, vol. 44, No. 25, The Japan Society of Applied Physics, JJAP Express Letter.
Hashimoto, Tadao et al., "Ammonothermal growth of bulk GaN," Journal of Crystal Growth, 2008, pp. 3907-3910; 310; Elsevier, www.elsevier.com/locate/jcrysgro.
Hashimoto, Tadao et al., "Ammonothermal Growth of GaN on an over-1-inch Seed Crystal," Japanese Journal of Applied Physics, 2005, pp. L 1570-L 1572, vol. 44, No. 52, The Japan Society of Applied Physics, JJAP Express Letter.
Inoue, T., et al., "Pressure-Controlled Solution Growth of Bulk GaN Crystals under High Pressure," 2001, pp. 15-27; 223, 15, Phys. Stat. Sol. (b).
Iwahashi, et al., "Effects of ammonia gas on threshold pressure and seed growth for bulk GaN single crystals by Na flux method," Journal of Crystal Growth, 2003, pp. 1-5, 253; Elsevier, www.elsevier.com/locate/jcrysgro.
Ketchum, Douglas R., et al. "Crystal growth of gallium nitride in supercritical ammonia," Journal of Crystal Growth, 2001, pp. 431-434, 222; Elsevier, www.elsevier.com/locate/jcrysgro.
Kumagai, Y., et al., "Growth of thick AlN layers by hydride vapor phase epitaxy," Journal Crystal Growth, 2005, pp. 62-67, vol. 281; Elsevier, www.elsevier.com/locate/jcrysgro.
Kumagai, Y., et al., "Hydride vapor phase epitaxy of AlN: thermodynamic analysis of aluminum source and its application to growth," Phys. Stat. Sol. ( c), 2003, pp. 2498-2501, vol. 0, No. 7.
Ledyaev, O., et al., Properties of AlN Layers Grown on SiC Substrates in Wide Temperature Range by HVPE, Phys. Stat. Sol. ( c) ,2002, pp. 474-478, No. 1.

(56) References Cited

OTHER PUBLICATIONS

Ohshima, E., et al., "Growth of the 2-in-size bulk ZnO single crystals by the hydrothermal method," Journal of Crystal Growth, 2004, pp. 166-170, 260; Elsevier, www.elsevier.com/locate/jcrysgro.
Peters, D. et al., "Ammonothermal Synthesis of Aluminum Nitride," Journal of Crystal Growth, 1990, pp. 411-418, 104.
Porowski. S., "Near Defect Free GaN Substrates," MRS Internet Journal of Nitride Semiconductors, Res. 4S1, 1999, G1.3.
Purdy, A. P., et al. "Ammonothermal Recrystallization of Gallium Nitride with Acidic Mineralizers," Cyst. Growth Design, 2002, pp. 141-145, vol. 2, No. 2.
Ramachandran, V. et al., "Inversion of wurtzite GaN(0001) by exposure to magnesium," Applied Physics Letters, Aug. 9, 1999, pp. 808-810, vol. 75, No. 6.
Wu, H. et al., "Rapid Synthesis of High Purity GaN Powder," Phys. Stat. Sol. (c), 2005, pp. 2074-2078, New York.
Yamane, Y., et al., "Growth of thick AlN layer on sapphire (0001) substrate using hydride vapor phase epitaxy," Phys. Stat. Sol. (c), 2005, pp. 2062-2065, vol. 2, No. 7.
U.S. Appl. No. 12/392,960 Amendment Dec. 21, 2012.
U.S. Appl. No. 13/491,392 Notice of Allowance dated Dec. 3, 2012.
U.S. Appl. No. 12/624,006 Office Action dated Feb. 28, 2013.
U.S. Appl. No. 12/580,849 Office Action dated Mar. 1, 2013.
U.S. Appl. No. 12/392,960 Office Action Apr. 9, 2013.
U.S. Appl. No. 12/455,760 Amendment filed Apr. 11, 2013.
JP2010188934 Amendment (Japanese and English translation) dated Mar. 7, 2013.
JP2010188935 Amendment (Japanese and English translation) dated Mar. 7, 2013.
JP2010188936 Amendment (Japanese and English translation) dated Mar. 7, 2013.
JP2010540956 Amendment (JP and English translation) dated Feb. 18, 2013.
JP2010540958 Amendment filed Dec. 21, 2012.
JP2010540958 Office Action (Japanese with English translation) Jan. 21, 2013.
JP2010548751 (Japanese and English translation) Amendment dated Jan. 7, 2013.
JP2010548951 Amendment (Japanese and English translation) dated Mar. 7, 2013.
JP2010548751 (Japanese and English translation) Office Action mailed Mar. 13, 2013.
EP09759458.4 Amendment dated Apr. 30, 2013.
PCT/US2010/033790, WO International Search Report dated Oct. 26, 2010, pp. 9.
PCT/US2010/033790, WO Written Opinion dated Oct. 26, 2010, pp. 11.
Schineller, B., et al. "Vertical -HVPE as a Production Method for Free-Standing GaN-Substrates", CS Mantech Conference, May 14-17, 2007 Austin TX [USA]; [Online] 07A, pp. 123-126, XP002592188; URL:http://www.gaasmantech.org/Digests/2007/2007%20Papers/07a.pdf.
U.S. Appl. No. 12/624,006 Amendment dated May 28, 2013.
U.S. Appl. No. 12/624,006 Office Action dated Aug. 9, 2013.
U.S. Appl. No. 12/580,849 Amendment dated Jun. 3, 2013.
U.S. Appl. No. 12/455,760 Office Action dated Jun. 6, 2013.
U.S. Appl. No. 13/728,769 Office Action dated May 23, 2013.
U.S. Appl. No. 12/392,960 Amendment dated Jun. 18, 2013.
U.S. Appl. No. 13/728,769 Terminal Disclaimer and Amendment dated Aug. 13, 2013.
U.S. Appl. No. 13/728,799 Notice of Allowance dated Aug. 15, 2013.
U.S. Appl. No. 13/728,769 Notice of Allowance dated Sep. 13, 2013.
U.S. Appl. No. 12/392,960 Office Action Oct. 25, 2013.
JP2010188934 Office Action (Japanese and English translation) dated May 14, 2013.
JP2010548951 Office Action (Japanese and English translation) dated May 14, 2013.
JP2010188934 Amendment (Japanese and English translation) dated Aug. 13, 2013.
JP2010548951 Amendment (Japanese and English translation) dated Aug. 13, 2013.
Wang, Buguo et al., "Ammonothermal Growth of GaN Crystals in Alkaline Solutions" Journal of Crystal Growth, Jan. 2006; pp. 376-380; vol. 287.
U.S. Appl. No. 12/624,006 Amendment dated Nov. 8, 2013.
JP2010188934 Office Action (Japanese and English translation) dated Nov. 12, 2013.
JP2010548951 Office Action (Japanese and English translation) dated Nov. 15, 2013.
EP09762938.0 Office Action dated Nov. 13, 2013.
TW098118664 Office Action (Taiwanese) dated Jan. 22, 2014 and Search Report (English), dated Jan. 12, 2014, 7 pages.
TW098118651 Office Action (Taiwanese) dated Jan. 22, 2014 and Search Report (English), dated Jan. 12, 2014, 7 pages.
JP201328632 (Japanese and English) Office Action dated Jan. 23, 2014.

\* cited by examiner

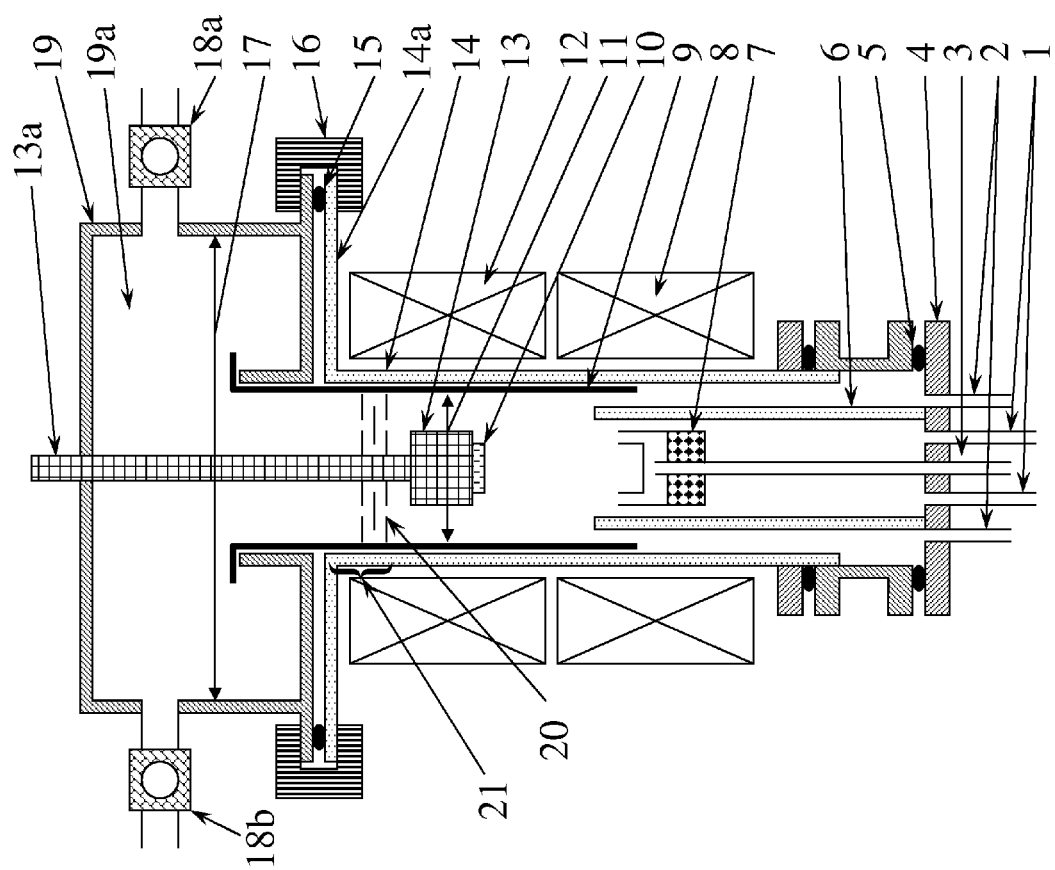

GROWTH REACTOR FOR GALLIUM-NITRIDE CRYSTALS USING AMMONIA AND HYDROGEN CHLORIDE

CROSS REFERENCE TO RELATED APPLICATIONS

This application claims priority under 35 U.S.C. §119 to U.S. Provisional Application Ser. No. 61/175,618 filed May 5, 2009, the disclosure of which is incorporated by reference in its entirety.

This application is further related to the following U.S. and PCT patent applications:

International Patent Application Serial No. PCT/US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS";

U.S. Provisional Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY";

U.S. Provisional Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS";

U.S. Provisional Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH";

U.S. Provisional Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL";

U.S. Provisional Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA";

U.S. Provisional Patent Application Ser. No. 61/106,110, filed on Oct. 16, 2008, by Tadao Hashimoto, Masanori Ikari, Edward Letts, entitled "DESIGN OF FLOW-RESTRICTING DEVICE IN THE HIGH-PRESSURE VESSEL FOR GROWING GROUP III NITRIDE CRYSTALS AND METHOD OF GROWING GROUP III NITRIDE CRYSTALS";

U.S. Provisional Patent Application Ser. No. 61/200,211, filed on Nov. 24, 2008, by Edward Letts, Tadao Hashimoto, Masanori Ikari, entitled "METHOD FOR PRODUCING GAN NUTRIENT FOR AMMONOTHERMAL GROWTH";

which applications are incorporated by reference herein in their entirety as if put forth in full below.

BACKGROUND

1. Field of the Invention

The invention is, in one instance, related to a production method of GaN or other group III-nitride crystals for use as nutrient or seed crystals in the ammonothermal method. GaN crystals grown using the current invention can also be used for successive device fabrication.

2. Description of the Existing Technology (Note: This patent application refers to several publications and patents as indicated with numbers within brackets, e.g., [x]. A list of these publications and patents can be found in the section entitled "References.")

Gallium nitride (GaN) and its related group III alloys are the key material for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage disc drives. The majority of these devices are grown epitaxially on heterogeneous substrates, such as sapphire and silicon carbide. The heteroepitaxial growth of group III nitride causes highly defected or even cracked films, which hinders the realization of high-end optical and electronic devices, such as high-brightness LEDs for general lighting or high-power microwave transistors.

Most of the problems inherent in heteroepitaxial growth could be avoided by instead using homoepitaxial growth. Single crystalline group III nitride wafers can be sliced from bulk group III nitride crystal ingots and then utilized for high-end homoepitaxial growth of optical and electronic devices. For the majority of devices, single crystalline GaN wafers are desired because it is relatively easy to control the conductivity of the wafer, and GaN wafers will provide the smallest lattice/thermal mismatch with device layers. However, the GaN wafers needed for homoepitaxial growth are currently expensive compared to heteroepitaxial substrates. This is because GaN wafers are currently produced with quasi-bulk growth method in which a thick layer of GaN is grown with hydride vapor phase epitaxy (HYPE) on a heteroepitaxial substrate followed by removal of the substrate. Due to an open reactor configuration for HYPE, the growth efficiency is not as high as the conventional bulk growth method used for other semiconductor materials such as Si and GaAs.

Although a "real" growth method of bulk GaN is ideal, it has been difficult to grow group III nitride crystal ingots due to their high melting point and high nitrogen vapor pressure at high temperature. Growth methods using molten Ga, such as high-pressure high-temperature synthesis [1,2] and sodium flux [3,4], have been proposed to grow GaN crystals. Nevertheless the crystal shape grown using molten Ga is a thin platelet because molten Ga has low solubility of nitrogen and a low diffusion coefficient of nitrogen.

The ammonothermal method, which is a solution growth method, is a promising alternative for bulk GaN growth and has been demonstrated to grow real bulk GaN ingots [5]. High-pressure ammonia, which has high transport speed and high solubility of GaN, is used as a fluid medium to grow bulk GaN. State-of-the-art ammonothermal method [6-8] requires a sufficient supply of source material. While pure Ga metal can be used as a source material, it provides an uneven growth rate as the surface of the Ga nitridizes. To provide a more stable growth rate, polycrystalline GaN is desirable as a starting material.

One method to produce GaN polycrystals is direct nitridization of Ga with ammonia [9]. Nevertheless, this method can only yield powder form of GaN (i.e. microcrystalline or nanocrystalline).

On the other hand, HVPE which utilizes gaseous ammonia, gaseous hydrogen chloride and metallic Ga is commonly used to produce GaN wafers for successive device fabrication. We found that HVPE can be applied to produce source materials for the ammonothermal method.

With HYPE, single crystalline GaN seed can be grown on a main susceptor and parasitic polycrystalline GaN deposited inside the reactor can also be used as a nutrient for the ammonothermal growth. However, the current HVPE reactors are designed to grow GaN for relatively short duration, typically for between 1 and 10 hours. In order to apply HYPE to produce source materials for the ammonothermal method, the reactor must be modified to extend growth duration.

SUMMARY OF THE INVENTION

One of the major limitations in extending growth duration of HVPE is clogging in the exhaust system by powder formation. The powder is mainly composed of ammonium halide such as ammonium chloride. To avoid clogging in the exhaust system, a second reaction chamber is added after a main reactor or first reactor chamber where GaN is produced. In the second reaction chamber, ammonium chloride formation may be enhanced and the ammonium chloride may be collected efficiently. To avoid ammonium chloride formation in the main reactor, the connection or "transition zone" between the main reactor and the second reaction chamber is maintained at elevated temperature. In addition or alternatively, the second reaction chamber may have two, three, or more exhaust lines which can be switched automatically to avoid overpressure of the system by clogging. These features together with details explained below help solve a clogging problem in the exhaust line of HVPE to extend the uninterrupted growth duration.

The reactor may be a vertical HVPE reactor or a horizontal HVPE reactor.

The substrate on which GaN or other III-V nitride material is deposited may be a material other than GaN or other than the III-V nitride material being deposited, respectively.

BRIEF DESCRIPTION OF THE DRAWINGS

Referring now to the drawings in which like reference numbers represent corresponding parts throughout:

FIG. 1 An schematic drawing of HVPE reactor.
1) Carrier gas inlet
2) Ammonia gas inlet
3) Hydrogen chloride gas inlet
4) Bottom flange of the main reactor
5) O-ring
6) Sheath tube
7) Ga container
8) Furnace for GaCl synthesis
9) PBN sheath to collect polycrystalline GaN
10) Seed for single crystalline GaN growth
11) Diameter for the growth region to measure cross sectional area
12) Furnace for GaN growth
13) Susceptor
13a) Shaft of the susceptor
14) Main reactor made of quartz tube
14a) End flange of the quartz tube
15) O-ring
16) Clamp
17) Diameter of the second reaction chamber to measure the cross sectional area
18) Valves
18a) First valve
18b) Second valve
19) Second reaction chamber
19a) Volume of the second reaction chamber
20) Baffles
21) Transition zone

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention. For instance, while GaN may be formed in a method and reactor as discussed herein, other group III-nitride compounds may be formed, such as AlGaN or InGaN.

TECHNICAL DESCRIPTION OF THE INVENTION

The present invention in one instance provides a reactor design to produce polycrystalline GaN nutrient and single crystalline GaN seeds for the ammonothermal growth of group III-nitride crystals, primarily group III-nitride single crystals that include at least the element Ga with the possible addition of another group III elements B, Al, and In, such as $Al_xGa_{1-x}N$ or $In_xGa_{1-x}N$ ($0 \leq x < 1$), or $Al_xIn_yGa_{1-x-y}N$ ($0 < x < 1$, $0 < y < 1$). The group III-nitride ingots are grown by the ammonothermal method which utilizes high-pressure $NH_3$ as a fluid medium, nutrient containing group III elements, and seed crystals that are group III-nitride single crystals. The high-pressure $NH_3$ provides high solubility of the nutrient and high transport speed of dissolved precursors. The ammonothermal growth requires a steady supply of a nutrient, such as Ga metal or GaN. A polycrystalline GaN source has the benefit of providing improved growth rate stability compared to Ga metal. Also, the ammonothermal growth requires single crystalline GaN seeds to initiate growth.

One method to produce polycrystalline GaN and single crystalline GaN suitable for the source material of the ammonothermal growth is the HVPE method. Nevertheless, HVPE is traditionally used for growing epitaxial film up to several hundreds of microns. Since the typical growth rate of GaN in HVPE is 50-150 μm/h, the growth reactor is designed to continue growth for up to ~10 hours. In order to produce GaN source for ammonothermal growth, however, HYPE reactor must be operated for longer duration. If HVPE reactor in the current technology were operated for over 24 hours, the exhaust line would be clogged with ammonium chloride.

Also, injection nozzle of source gases (i.e. ammonia and gallium chloride) would be clogged unless the nozzle is properly designed.

To solve the above-mentioned problem, the current invention discloses a new design of HVPE reactor. To avoid clogging in the exhaust system, a second reaction chamber is added after a main reactor where GaN is produced. The second reaction chamber will enhance ammonium chloride formation and the powder is collected efficiently in it. To avoid ammonium chloride formation in the main reactor, the connection between the main reactor and the second reaction chamber is maintained at elevated temperature. In addition, the second reaction chamber has two or more exhaust lines, such as three or four or five or six exhaust lines. If one exhaust line is clogged with powder, the valve for an alternative exhaust line will open and the valve for the clogged line is closed to avoid overpressure of the system.

A reactor design in accordance with the current invention is explained. These features and other details are explained below together with the FIG. 1.

The HVPE reactor in FIG. 1 is a vertical type reactor with source gas inlets located at the bottom and exhaust lines located at the top. The HYPE reactor consists of a main reactor made of quartz tube 14) and a second reaction chamber made of stainless steel 19).

The bottom end of the main reactor is capped with a bottom flange 4). The bottom flange 4) has carrier gas inlet 1), ammonia gas inlet 2) and hydrogen chloride gas inlet 3).

The main reactor 4) is surrounded with a furnace for GaCl synthesis 8) and a furnace for GaN growth 12). The hydrogen chloride inlet is connected to a Ga container 7) where $GaCl_x$ (x=1, 2 or 3) is synthesized. $GaCl_x$ is successively supplied to the seed crystal through an appropriate gas nozzle. Carrier gas such as nitrogen and/or hydrogen is fed through a sheath tube 6) in order to help isolate the ammonia flow and the $GaCl_x$ flow until the gases meet at the seed surface.

To grow single crystalline GaN, a seed crystal 10) is mounted face-down on a susceptor 13). The susceptor 13) helps to achieve uniform temperature over the surface of the seed crystal 10) so that single crystalline GaN is uniformly grown on the seed crystal 10).

The height of the susceptor 13) can be raised with a rod 13a) during the growth process so that the location of the growth front on the seed is maintained at the same level. Also, the susceptor 13) can be rotated by rotating the rod 13a) to improve uniformity of gas supply and temperature.

The main reactor 14) is lined with a PBN sheath 9) which extends to a point lower than the mixing point of the gases, so that any parasitic deposition of polycrystalline GaN occurs on the PBN sheath 9). In this way, polycrystalline GaN nutrient can be collected efficiently on the PBN sheath 9).

Baffles 20) are located in a transition zone 21) of the reactor above the susceptor 13). The baffles reduce the amount of heat transferred from the main or first reactor chamber into the second reactor chamber. The baffles 20) also prevent the ammonium chloride powder from falling back to the main reactor 14) from the second reaction chamber 19). Although there are holes in the baffles to let gas through, the holes in successive baffles are preferably offset such that the baffles do not provide a direct optical path from the second reactor chamber to the first. The baffles are preferably positioned in or adjacent to the heated zone so that the temperature is sufficiently high to avoid deposition of ammonium chloride.

The upper end of the quartz tube for the main reactor 14) may have a wide end flange 14a) which meets the flange of the second reaction chamber 19). The O-ring is preferably located sufficiently far from the center of the reactor so that the connection between the main reactor 14) and the second reaction chamber 19) can be maintained at a temperature above 200° C., preferably above 350° C. If necessary, the O-ring can be cooled with air or fluid.

Since the sublimation temperature of ammonium chloride is 338° C., ammonium chloride powder deposition on the connection or transition zone can be avoided in this design. The residual gas is introduced into the second reaction chamber 19) without forming ammonium chloride powder in the main reactor 14).

In the second reaction chamber 19), on the other hand, formation of ammonium chloride powder is enhanced because the gas slows down and cools down. To increase residence time of the gas, the cross section (measured at 17) of the second reaction chamber is set larger than that of the main reactor (measured at 11). The second reaction chamber 19) can have fins or baffles which act as a powder collector and/or help powder settle from the gas stream.

The second reaction chamber 19 has more than one exhaust line. In FIG. 1, one exhaust line with isolation valve 18a is initially used and the isolation valve 18b) in the exhaust line is closed. When ammonium chloride powder builds up in the first exhaust line and the reactor pressure exceeds a certain limit, the isolation valve 18b) opens to switch the exhaust path from the first line to the second line. The system can have more than 2 exhaust lines so that growth can be continued for a longer duration.

The HVPE reactor with the second reactor chamber disclosed herein avoids deposition of ammonium chloride in the main chamber. The second reactor chamber enhances formation of ammonium chloride powder and collects it efficiently so that clogging of the exhaust line is avoided. In addition, multiple exhaust lines with automatic valve switching further extends growth duration without interruption by clogging.

ADVANTAGES AND IMPROVEMENTS

The present application discloses a new HVPE reactor which, in some embodiments, can be operated more than 24 hours. Uninterrupted long growth of GaN in HVPE can produce single crystalline seed of sufficient thickness together with enough polycrystalline GaN to use in ammonothermal growth of group III-nitride crystals. Since both single crystalline and polycrystalline GaN are used as source material for the ammonothermal growth, the process is quite efficient. The current invention will therefore enable improvements in productivity of GaN bulk crystals by the ammonothermal method.

REFERENCES

The following references are incorporated by reference herein:

[1]. S. Porowski, MRS Internet Journal of Nitride Semiconductor, Res. 4S1, (1999) G1.3.

[2] T. Inoue, Y. Seki, O. Oda, S. Kurai, Y. Yamada, and T. Taguchi, Phys. Stat. Sol. (b), 223 (2001) p. 15.

[3] M. Aoki, H. Yamane, M. Shimada, S. Sarayama, and F. J. DiSalvo, J. Cryst. Growth 242 (2002) p. 70.

[4] T. Iwahashi, F. Kawamura, M. Morishita, Y. Kai, M. Yoshimura, Y. Mori, and T. Sasaki, J. Cryst Growth 253 (2003) p. 1.

[5] T. Hashimoto, F. Wu, J. S. Speck, S. Nakamura, Jpn. J. Appl. Phys. 46 (2007) L889.

[6] R. Dwiliński, R. Doradzitiski, J. Garczyński, L. Sierzputowski, Y. Kanbara, U.S. Pat. No. 6,656,615.

[7] K. Fujito, T. Hashimoto, S. Nakamura, International Patent Application No. PCT/US2005/024239, WO07008198.

[8] T. Hashimoto, M. Saito, S. Nakamura, International Patent Application No. PCT/US2007/008743, WO07117689. See US20070234946, U.S. application Ser. No. 11/784,339 filed Apr. 6, 2007.

[9] H. Wu, J. Hunting, F. DiSalvo, M. Spencer, Phys. Stat. Sol. (c), 2 No. 7 (2005) p. 2074.

Each of the references above is incorporated by reference in its entirety as if put forth in full herein and particularly with respect to description of methods of growth using ammonothermal methods and using gallium nitride substrates.

CONCLUSION

This concludes the description of the preferred embodiment of the invention. The following describes some alternative embodiments for accomplishing the present invention.

In the preferred embodiment, specific design of growth apparatuses is presented. However, other constructions or designs that fulfill the conditions described herein will have the same benefit as the example.

In the preferred embodiment, a vertical reactor with a face down seed is explained. However, a vertical reactor with a face up seed, a horizontal reactor with a face up or down seed, or any other reactor design that fulfill the conditions described herein will have the same benefit as the example.

The present invention does not have any limitations on the size of the reactor or the amount recycled or grown, so long as the same benefits can be obtained.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The appended claims are incorporated by reference into the specification in their entirety and therefore are as much of a discussion of the invention as the text above.

What is claimed is:

1. A hydride vapor phase epitaxy reactor for growing a group III-nitride crystalline material, comprising
    (a) a reactor body formed of a material compatible with reactants for growing the group III-nitride crystalline material;
    (b) a first gas inlet for introducing a first reactant comprising a halide gas;
    (c) a second gas inlet for introducing a second reactant comprising ammonia;
    (d) a stand in a first reactor zone in a chamber of the reactor body to hold a substrate upon which the group III-nitride crystalline material is grown;
    (e) a transition zone downstream of the stand;
    (f) a second reactor zone downstream of the transition zone; and
    (g) one or more heaters positioned and configured to heat the first reaction zone and the transition zone but not the second reactor zone chamber to a temperature above the precipitation temperature of ammonium halide, such that the ammonium halide precipitates in the second reactor zone during operation; and
    (h) wherein the reactor has a removable liner for growing polycrystalline group III-nitride material in and removing said polycrystalline group III-nitride material from the reactor.

2. A hydride vapor phase epitaxy reactor according to claim 1 wherein the removable liner comprises pyrolytic boron nitride.

3. A hydride vapor phase epitaxy reactor according to claim 1 wherein the second reactor zone has a cross-sectional area in a direction of gas flow that is sufficiently large to allow precipitated ammonium halide to settle and form a depleted exhaust gas.

4. A hydride vapor phase epitaxy reactor according to claim 1 wherein the second reactor zone has a reservoir sufficiently large to collect settled precipitated ammonium halide.

5. The reactor of claim 4, wherein the reservoir has more than one isolation valve.

6. The reactor of claim 5, wherein overpressure of the reservoir is avoided by automatic switching of the isolation valves.

7. The reactor of claim 4, wherein the reactor has plural plates with openings located between the first reactor zone and a reservoir of the second reactor zone, the openings of the plates are offset to not provide a direct optical path from the first reactor zone to said reservoir, and the plates are located in a position where the temperature is between 300° C. to 700° C. in operation.

8. A hydride vapor phase epitaxy reactor for growing a group III-nitride crystalline material, comprising
    (a) a reactor body formed of a material compatible with reactants for growing the group III-nitride crystalline material;
    (b) a first gas inlet for introducing a first reactant comprising a halide gas;
    (c) a second gas inlet for introducing a second reactant comprising ammonia;
    (d) a stand in a first reactor zone in a chamber of the reactor body to hold a substrate upon which the group III-nitride crystalline material is grown;
    (e) a transition zone downstream of the stand;
    (f) a second reactor zone downstream of the transition zone; and
    (g) one or more heaters positioned and configured to heat the first reaction zone and the transition zone but not the second reactor zone to a temperature above the precipitation temperature of ammonium halide, such that the ammonium halide precipitates in the second reactor zone during operation; and wherein
    (h) the first reactor zone is constructed with a quartz tube,
    (i) the second reactor zone has a reservoir constructed as a metal chamber,
    (j) the quartz tube and the metal chamber are connected with an O-ring-sealed flange,
    (k) the location of the O-ring of the sealed flange is separated from the waste gas stream by a sufficient distance that the temperature of a wall at the O-ring-sealed flange and touching the waste gas stream is maintained higher than 200° C. in operation.

9. The reactor of claim 8, wherein the O-ring of the sealed flange is separated from the waste gas stream by a sufficient distance that the temperature of the wall at the O-ring-sealed flange and touching the waste gas stream is maintained higher than 350° C. in operation.

10. The reactor of claim 8, wherein the O-ring of the sealed flange is cooled with air or fluid.

\* \* \* \* \*